United States Patent
Wagner et al.

(10) Patent No.: US 11,933,683 B2
(45) Date of Patent: Mar. 19, 2024

(54) STRAIN GAUGE AND STRAIN MEASUREMENT ASSEMBLY

(71) Applicants: Measurement Specialties, Inc., Hampton, VA (US); Tyco Electronics AMP Korea Co., Ltd., Kyongsangbuk-Do (KR)

(72) Inventors: David Eric Wagner, Fremont, CA (US); James Hoffman, Fremont, CA (US); Kim Young-Deok, Songpa District (KR)

(73) Assignees: TE CONNECTIVITY SOLUTIONS GMBH, Schaffhausen (CH); TYCO ELECTRONICS AMP KOREA CO., LTD., Jilyang (KR)

( * ) Notice: Subject to any disclaimer, the term of this patent is extended or adjusted under 35 U.S.C. 154(b) by 301 days.

(21) Appl. No.: 17/011,352

(22) Filed: Sep. 3, 2020

(65) Prior Publication Data
US 2022/0065715 A1    Mar. 3, 2022

(51) Int. Cl.
*G01L 1/00* (2006.01)
*G01L 1/22* (2006.01)
*H10N 30/30* (2023.01)

(52) U.S. Cl.
CPC ......... *G01L 1/2293* (2013.01); *H10N 30/302* (2023.02)

(58) Field of Classification Search
CPC .......................... G01L 1/2293; H01L 41/1132
See application file for complete search history.

(56) References Cited

U.S. PATENT DOCUMENTS

| | | | | |
|---|---|---|---|---|
| 3,323,358 | A * | 6/1967 | Fraioli | G01L 9/0098 623/24 |
| 4,320,664 | A * | 3/1982 | Rehn | G01L 9/0054 338/42 |
| 5,172,211 | A * | 12/1992 | Godinho | H01L 27/1112 257/536 |
| 6,049,115 | A | 4/2000 | Takahashi et al. | |
| 6,341,528 | B1 | 1/2002 | Hoffman et al. | |
| 6,568,276 | B1 | 5/2003 | Ciminelli | |
| 6,635,910 | B1 | 10/2003 | Gross | |
| 6,950,426 | B2 | 9/2005 | Abel et al. | |
| 6,952,042 | B2 * | 10/2005 | Stratton | G01L 19/0627 257/419 |
| 7,633,373 | B1 * | 12/2009 | Johnson | H01C 7/006 338/195 |
| 7,723,232 | B2 * | 5/2010 | Legat | B81C 1/00158 438/689 |

(Continued)

FOREIGN PATENT DOCUMENTS

| | | |
|---|---|---|
| JP | H07162018 A | 6/1995 |
| JP | H09072805 A | 3/1997 |

(Continued)

OTHER PUBLICATIONS

Extended European Search Report, European Application No. 21194823.7-1010, European Filing Date Jan. 5, 2022.

(Continued)

*Primary Examiner* — Max H Noori

(57) ABSTRACT

A strain gauge includes a resistor formed of a doped silicon material, a conductive shield, and an isolation element disposed between the resistor and the conductive shield. The isolation element electrically isolates the resistor from the conductive shield.

18 Claims, 3 Drawing Sheets

(56) References Cited

U.S. PATENT DOCUMENTS

| | | | |
|---|---|---|---|
| 9,890,033 B2* | 2/2018 | Brown | H01L 21/86 |
| 2002/0003274 A1 | 1/2002 | Bryzek et al. | |
| 2003/0230147 A1 | 12/2003 | Stratton et al. | |
| 2006/0214202 A1 | 9/2006 | Zorich et al. | |
| 2007/0093015 A1* | 4/2007 | Kudo | H01L 21/823835 |
| | | | 438/257 |
| 2021/0175410 A1* | 6/2021 | Van Der Wiel | G01L 1/2293 |
| 2021/0343467 A1* | 11/2021 | Song | H01F 27/2885 |

FOREIGN PATENT DOCUMENTS

| | | |
|---|---|---|
| JP | H09280809 A | 10/1997 |
| JP | H10160610 A | 6/1998 |
| JP | 2002162303 A | 6/2002 |
| JP | 2007324566 A | 12/2007 |
| JP | 2019002781 A | 1/2019 |
| WO | 2017006840 A1 | 2/2018 |
| WO | 2017056673 A1 | 2/2018 |

OTHER PUBLICATIONS

Japanese Office Action with English translation thereof, dated Oct. 4, 2022 in Application 2021140802, 28 pages.
Chinese Office Action with English translation thereof, dated Sep. 1, 2023 in Application No. 202111009509.9, 27 pages.

\* cited by examiner

STRAIN GAUGE AND STRAIN MEASUREMENT ASSEMBLY

FIELD OF THE INVENTION

The present invention relates to a strain gauge and, more particularly, to a strain gauge including a piezoresistor.

BACKGROUND

Semiconductor silicon strain gauges operate on the piezoresistive effect, changing in resistivity when mechanical strain is applied. A voltage across the strain gauge is measured to determine the strain of an object to which the semiconductor silicon strain gauge is attached.

Semiconductor silicon strain gauges, however, are affected by external fields and mobile ions. Mobile ions are generated when the strain gauge is produced or in the installation of the gage and are generally randomly distributed prior to use of the strain gauge. As the strain gauge is used, the mobile ions gather in a reverse direction of the voltage potential; the ion migration is accelerated by a bias voltage and by applications involving high temperature or high humidity. The concentrated gatherings of mobile ions form a leakage current path and change the resistance of strain gauge particularly in areas of high potential. Variations in external field charge can also vary the resistance of the strain gauge. The change in the resistance of the strain gauge caused by the external fields or mobile ions can lead to drift, instability, and other forms of erroneous strain measurements.

SUMMARY

A strain gauge includes a resistor formed of a doped silicon material, a conductive shield, and an isolation element disposed between the resistor and the conductive shield. The isolation element electrically isolates the resistor from the conductive shield.

BRIEF DESCRIPTION OF THE DRAWINGS

The invention will now be described by way of example with reference to the accompanying Figures, of which.

DETAILED DESCRIPTION OF THE EMBODIMENTS

Figure 1:
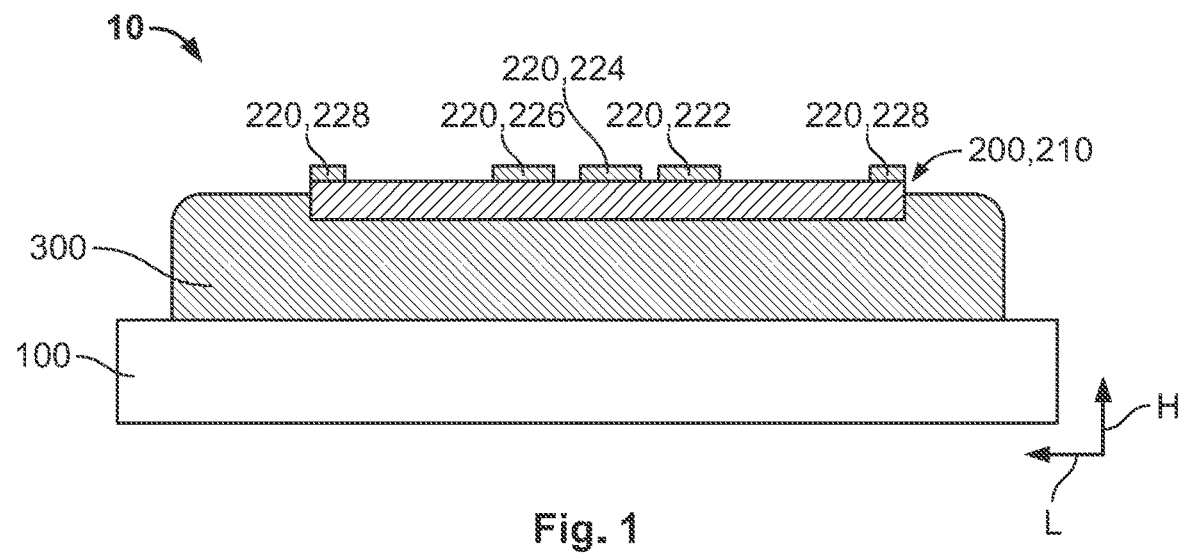
FIG. 1 is a schematic side view of a strain measurement assembly according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art. In addition, in the following detailed description, for purposes of explanation, numerous specific details are set forth in order to provide a thorough understanding of the disclosed embodiments. However, it is apparent that one or more embodiments may also be implemented without these specific details.

A strain measurement assembly 10 according to an embodiment, as shown in FIG. 1, comprises a force responsive member 100, a strain gauge 200, and an attachment material 300 attaching the strain gauge 200 to the force responsive member 100. A strain of the force responsive member 100 as the result of an applied force is measured and output by the strain gauge 200.

The force responsive member 100, as shown in FIG. 1, extends along a longitudinal direction L. The force responsive member 100 is made of a flexural material, the flexing of which is measured by the strain gauge 200 as described in greater detail below. In an embodiment, the flexural material of the force responsive member 100 may be a metal, such as a stainless steel. In other embodiments, the flexural material may be any material that flexes under an applied force and is capable of being attached to the strain gauge 200 described herein.

The attachment material 300, as shown in FIG. 1, is positioned between the force responsive member 100 and the strain gauge 200 in a height direction H perpendicular to the longitudinal direction L. The attachment material 300 has a liquid state in which it is applied between the force responsive member 100 and the strain gauge 200 and a cured state in which the attachment material 300 is hardened to secure the strain gauge 200 to the force responsive member 100. The attachment material 300, in various embodiments, may be a glass, an epoxy, or a polymer material. In other embodiments, the attachment material 300 may be any material capable of attaching the strain gauge 200 to the force responsive member 100 and transmitting a strain of the force responsive member 100 to the strain gauge 200.

Figure 2:
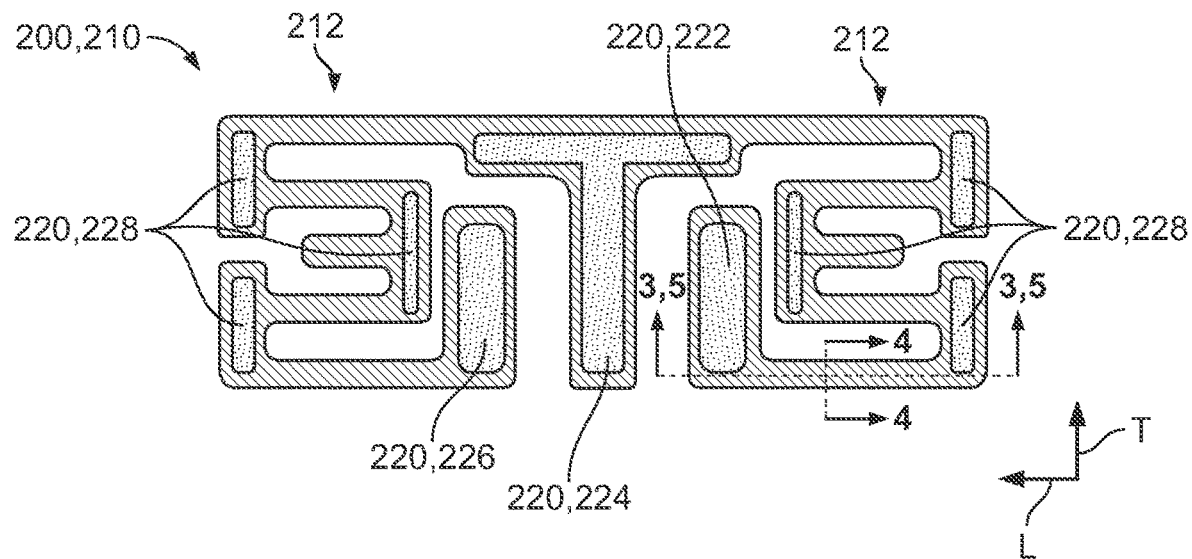
FIG. 2 is a top view of a strain gauge according to an embodiment formed as a half bridge.

In the embodiment shown in FIGS. 1 and 2, the strain gauge 200 is formed as a half Wheatstone bridge 210 (also referred to as a "half bridge" herein). The half bridge 210 has a pair of resistive sections 212 and a plurality of contact pads 220. One of the resistive sections 212 extends between a first contact pad 222 of the contacts pads 220 and a second contact pad 224 of the contact pads 220. Another one of the resistive sections 212 extends between the second contact pad 224 and a third contact pad 226. A plurality of intermediate contacts pads 228 are positioned on each of the resistive sections 212.

Each of the contact pads 220 is formed of a conductive material. In an embodiment, each of the contact pads 220 is formed of a metal material, such as aluminum or a gold alloy. In other embodiments, the contact pads 220 can be formed from any other wire bondable conductive material.

Figure 3:
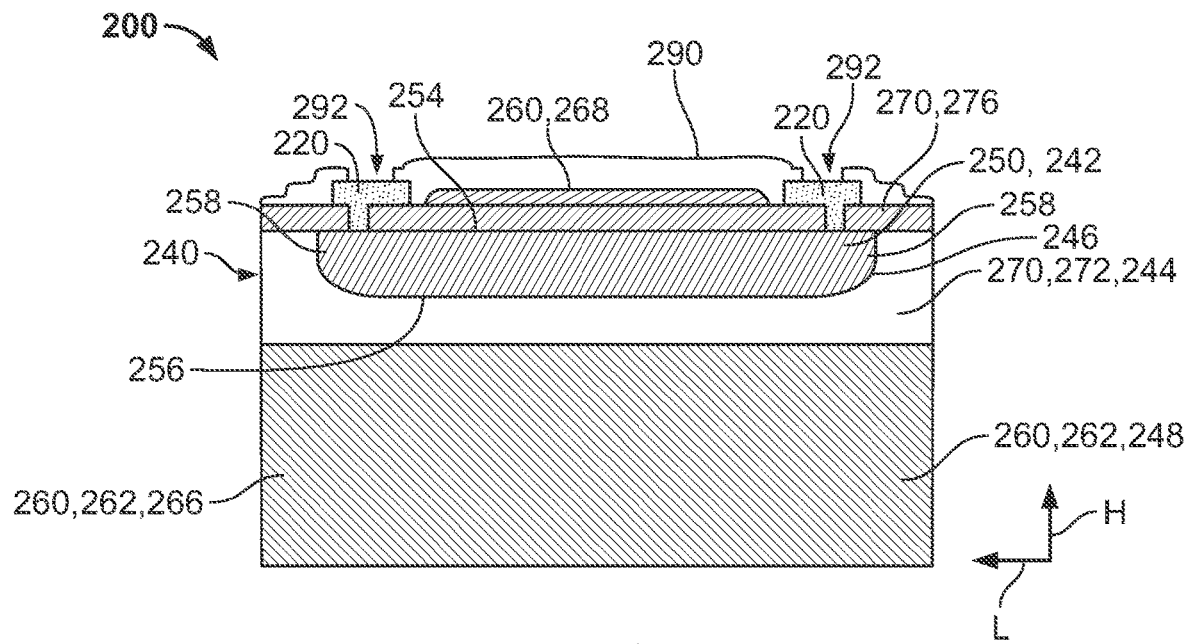
FIG. 3 is a schematic sectional view of the strain gauge of FIG. 2.
Figure 4:
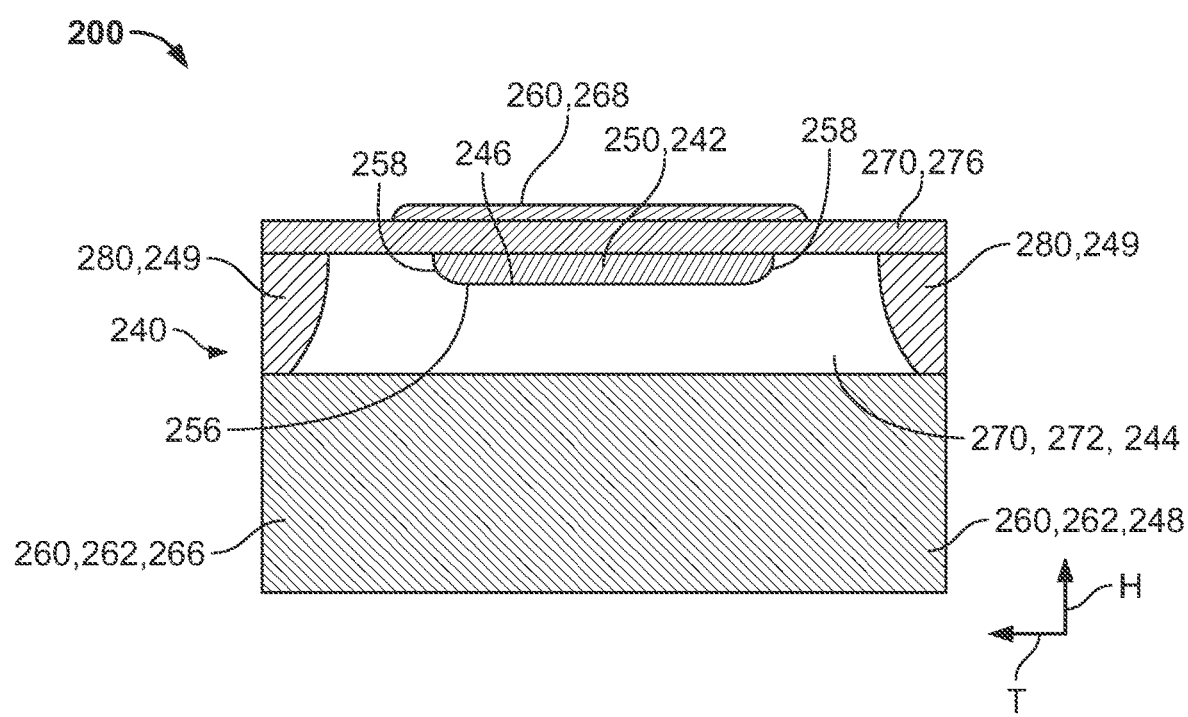
FIG. 4 is a schematic sectional view of the strain gauge of FIG. 2, taken along a direction perpendicular to FIG. 3.

A junction isolated layered structure of the strain gauge 200 according to an embodiment is shown in FIGS. 3 and 4. The layered structure of this embodiment as shown in FIG. 3 is exemplarily taken from a section along line 3-3 in FIG. 2 but applies equally to all portions of the strain gauge 200 extending along the longitudinal direction L between two contact pads 220. The layered structure of this embodiment as shown in FIG. 4 is exemplarily taken from a section along line 4-4 in FIG. 2 but applies equally to all similar portions of the strain gauge 200.

In the embodiment shown in FIGS. 3 and 4, the strain gauge 200 includes a silicon substrate 240, a resistor 250 disposed in the silicon substrate 240, a conductive shield 260, an isolation element 270 disposed between the resistor 250 and the conductive shield 260 and electrically isolating the resistor 250 from the conductive shield 260, a guard ring 280 disposed in the silicon substrate 240, and a passivation layer 290.

The silicon substrate 240, in an embodiment, is formed of a monocrystalline silicon that is doped to form an n-type doped silicon material. The n-type doping is formed by doping the monocrystalline silicon of the silicon substrate 240 with phosphorous. In other embodiments, the n-type doping can be formed by doping with arsenic, antimony, bismuth, lithium, or any other elements used for n-type doping of silicon structures. The n-type doping can be performed with ion implantation, epitaxial growth, or any combination thereof.

The resistor 250, in the embodiment shown in FIG. 3, is formed by doping a portion of the silicon material of the silicon substrate 240. In the embodiment shown in FIG. 3, the resistor 250 is formed by a p-type doped section 242 of the silicon substrate 240. The p-type doped section 242 is formed by doping the silicon substrate 240 with boron. In other embodiments, the p-type doping can be formed by doping with gallium, indium, aluminum, or any other elements used for p-type doping of silicon structures. The p-type doping can be performed with ion implantation and/or diffusion.

The resistor 250, as shown in FIG. 3, has an upper side 254 and a lower side 256 opposite the upper side 254 in the height direction H. The resistor 250 has a plurality of lateral sides 258 opposite each other in the longitudinal direction L and opposite each other in a lateral direction T, extending in the height direction H, and connecting the lower side 256 and the upper side 254. The lateral direction T, shown in FIG. 4, is perpendicular to both the longitudinal direction L and the height direction H.

The conductive shield 260, as shown in FIG. 3, includes a first conductive shield 262 and a second conductive shield 268. In an embodiment, the first conductive shield 262 is formed by further n-type doping of the silicon substrate 240 to form a first n+-type highly doped section 248. In another embodiment, the first conductive shield 262 is formed from a metal layer 266 separate from the silicon substrate 240. The metal layer 266 can be formed from aluminum, titanium, tungsten, chrome, polysilicon, or any other metallic material that is highly conductive. The second conductive shield 268 is a separate element from the silicon substrate 240 and can be formed as a separate n+-type highly doped silicon substrate, a metal layer similar to the metal layer 266, or any other conductive material.

As shown in FIG. 3, the isolation element 270 includes a first isolation element 272 and a second isolation element 276. In the embodiment shown in FIG. 3, the first isolation element 272 is formed by an n-type doped section 244 of the silicon substrate 240 that remains after forming the p-type doped section 242 and, in an embodiment, after forming the first n+-type highly doped section 248. The n-type and p-type doping of the silicon substrate 240 forms a p-n junction 246 at a boundary between the p-type doped section 242 of the resistor 250 and the n-type doped section 244 forming the first isolation element 272. The n-type doped section 244 acts as the first isolation element 272 under an applied bias voltage.

As shown in FIG. 3, at least the resistor 250 and the first isolation element 272, and in an embodiment also the first conductive shield 262, are formed within the single silicon substrate 240. The first isolation element 272 surrounds the lower side 256 and the plurality of lateral sides 258 of the resistor 250. The first isolation element 272 is positioned between the resistor 250 and the first conductive shield 262 in the height direction H and, whether the first conductive shield 262 is formed from the first n+-type highly doped section 248 or the metal layer 266, the first isolation element 272 electrically isolates the resistor 250 from the first conductive shield 262. The first conductive shield 262 is disposed on a side of the first isolation element 272 opposite the resistor 250 in each embodiment. In the embodiment in which the first conductive shield 262 is formed from the metal layer 266, the silicon substrate 240 is positioned on the metal layer 266.

The second isolation element 276, as shown in FIG. 3, is an element separate from the silicon substrate 240 and is formed of a dielectric material. In an embodiment, the second isolation element 276 is formed of an oxide, such as silicon dioxide, or of silicon nitride. In other embodiments, the second isolation element 276 may be formed of any dielectric material that is compatible with the adjoining materials described herein.

The second isolation element 276 is positioned on the upper side 254 of the resistor 250, as shown in FIG. 3. In the embodiment of FIG. 3, the second isolation element 276 is positioned on and extends over an entire upper surface of the silicon substrate 240. The second conductive shield 268 is positioned on the second isolation element 276, on a side of the second isolation element 276 opposite the silicon substrate 240 and the resistor 250. The second isolation element 276 is positioned between the resistor 250 and the second conductive shield 268 in the height direction H and electrically isolates the resistor 250 from the second conductive shield 268.

The contact pads 220, as shown in FIG. 3, are positioned on the second isolation element 276, on the side of the second isolation element 276 opposite the silicon substrate 240 and the resistor 250. The contact pads 220 extend through the second isolation element 276 and contact the resistor 250, forming an electrical connection with the resistor 250. The contact pads 220 are electrically isolated from the second conductive shield 268.

The passivation layer 290, as shown in FIG. 3, is positioned over the second conductive shield 268 and a portion of the second isolation element 276. The passivation layer 290 has a window 292 at each of the contact pads 220 through which the passivation layer 290 is open to the contact pad 220. In an embodiment, wire bonding to the contact pads 220 is performed through the windows 292. The passivation layer 290 is formed of a non-conductive material that prevents damage and/or corrosion to the second conductive shield 268. In an embodiment, the passivation layer 290 is silicon nitride. In other embodiments, the passivation layer 290 may be a polymer such as polyamide, a PECVD nitride, or any other type of oxide.

The junction isolated layered structure of the strain gauge 200 is shown sectioned along the height direction H and the lateral direction T in FIG. 4. The section shown in FIG. 4 is thus taken perpendicular to the section of the same embodiment shown in FIG. 3.

As shown in FIG. 4, the guard ring 280 is formed by further n-type doping of the silicon substrate 240 to form a plurality of second n+-type highly doped sections 249. The second n+-type highly doped sections 249 extend from the second isolation element 276, at the upper surface of the silicon substrate 240, to the first conductive shield 262 along the height direction H; a portion of each of the second n+-type highly doped sections 249 is disposed at a same height as the resistor 250 along the height direction H. The second n+-type highly doped sections 249 of the guard ring 280 are spaced apart from the lateral sides 258 of the resistor 250 in the lateral direction T. The first isolation element 272 formed as the n-type doped section 244 is positioned between the second n+-type highly doped sections 249 and the resistor 250 in the lateral direction T. In the embodiment in which the first conductive shield 262 is the first n+-type highly doped section 248, the second n+-type highly doped sections 249 can connect with the similarly formed first n+-type highly doped section 248.

Figure 5:
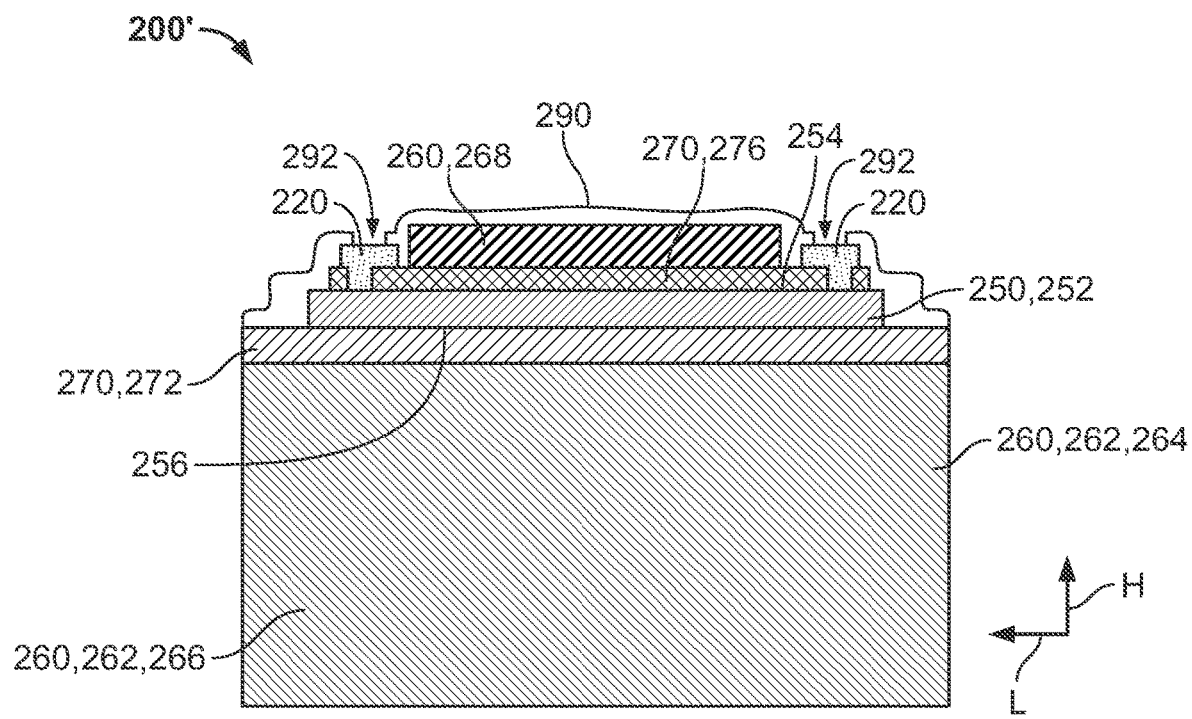
FIG. 5 is a schematic sectional view of a strain gauge according to another embodiment.

A silicon-on-insulator layered structure of the strain gauge 200' according to another embodiment is shown in FIG. 5. The layered structure of this embodiment is, similarly to the embodiment shown in FIG. 3, exemplarily taken from a section along line 5-5 in FIG. 2, but applies equally to all portions of the strain gauge 200' extending between two contact pads 220. Like reference numerals refer to like elements, and primarily the differences with respect to the embodiment shown in FIGS. 3 and 4 will be described in detail herein.

In the embodiment shown in FIG. 5, the strain gauge 200' does not include the silicon substrate 240 of the strain gauge 200 that has multiple doping sections. The resistor 250 is instead formed by p-type doping of an individual silicon layer. The individual silicon layer is etched using dry etching or wet etching to remove silicon from around the doped areas and form a p-type doped silicon layer 252. The resistor 250 formed as the p-type doped silicon layer 252 has an upper side 254 and a lower side 256 opposite the upper side 254 in the height direction H.

In the strain gauge 200' shown in FIG. 5, the first conductive shield 262 is formed by highly n-doping an individual silicon substrate that is separate from the layer of the resistor 250. The individual silicon layer is etched using dry etching or wet etching to remove silicon from around the doped areas and form a n+-type highly doped silicon substrate 264. In another embodiment, the first conductive shield 262 can be formed from the metal layer 266 similarly to the embodiment shown in FIGS. 3 and 4. The second conductive shield 268 is a separate element and can be formed as a separate n+-type highly doped silicon substrate, a metal layer similar to the metal layer 266, or any other conductive material.

The first isolation element 272 and the second isolation element 276, in the strain gauge 200' shown in FIG. 5, are each formed as individual, separate elements from a dielectric material. In an embodiment, the first isolation element 272 and the second isolation element 276 are each formed of an oxide, such as silicon dioxide, or of silicon nitride. In other embodiments, the first isolation element 272 and the second isolation element 276 may each be formed of any dielectric material that is compatible with the adjoining materials described herein.

As shown in FIG. 5, in the strain gauge 200', each of the layers of the silicon-on-insulator layered structure is formed as a separate layer. The lower side 256 of the resistor 250 is positioned on the first isolation element 272, and the first isolation element 272 is positioned on and over the first conductive shield 262. The first isolation element 272 is positioned between the resistor 250 and the first conductive shield 262 in the height direction H and, whether the first conductive shield 262 is formed as the n+-type highly doped silicon substrate 264 or the metal layer 266, the first isolation element 272 electrically isolates the resistor 250 from the first conductive shield 262.

The second isolation element 276 is positioned on the upper side 254 of the resistor 250, as shown in FIG. 5, and the second conductive shield 268 is positioned on the second isolation element 276, on a side of the second isolation element 276 opposite the resistor 250. The second isolation element 276 is positioned between the resistor 250 and the second conductive shield 268 in the height direction H and electrically isolates the resistor 250 from the second conductive shield 268.

The contact pads 220, as shown in FIG. 5, are positioned on the second isolation element 276, on the side of the second isolation element 276 opposite the resistor 250. The contact pads 220 extend through the second isolation element 276 and contact the resistor 250, forming an electrical connection with the resistor 250. The contact pads 220 are electrically isolated from the second conductive shield 268.

The passivation layer 290, as shown in FIG. 5, is positioned over the second conductive shield 268, a portion of the second isolation element 276, a portion of the p-type doped silicon layer 252, and a portion of the first isolation element 272. The passivation layer 290 has the window 292 at each of the contact pads 220 through which the passivation layer 290 is open to the contact pad 220.

Figure 6:
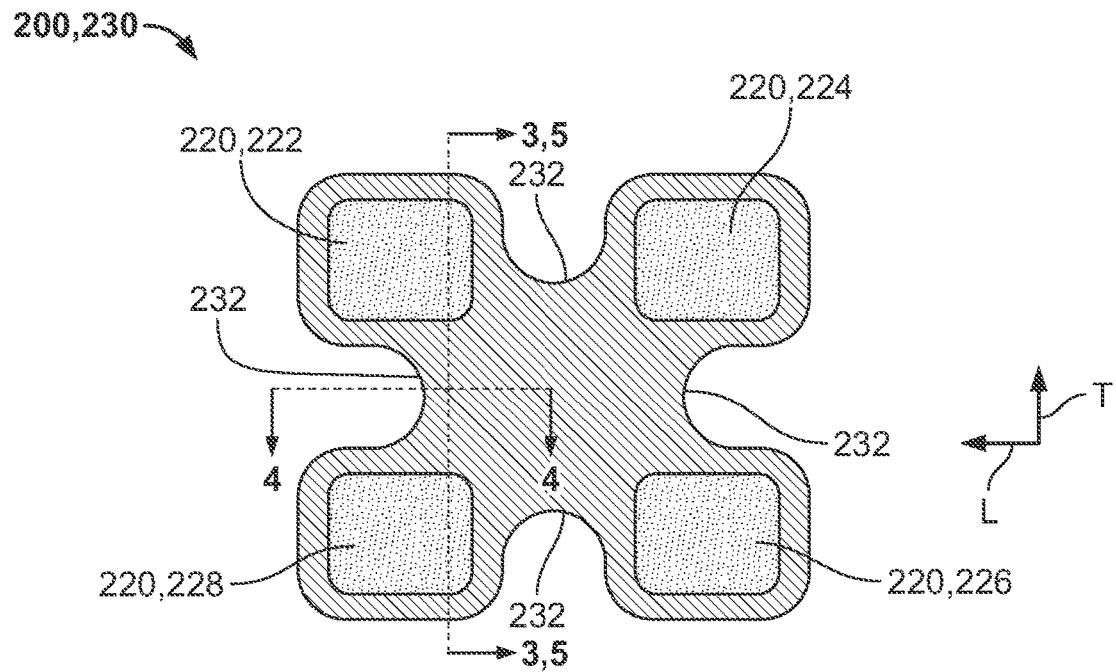
FIG. 6 is a top view of a strain gauge according to an embodiment formed as a full bridge.

In another embodiment shown in FIG. 6, the strain gauge 200 shown in FIGS. 3 and 4 or the strain gauge 200' shown in FIG. 5 can similarly be used to form a full Wheatstone bridge 230 (also referred to as a "full bridge" herein). The full bridge 230 has four resistive sections 232 and a plurality of contact pads 220. One of the resistive section 232 extends between each pair of a first contact pad 222, a second contact pad 224, a third contact pad 226, and a fourth contact pad 228. The sections of the embodiments shown in FIGS. 3-5 are indicated on FIG. 6 and apply to each of the resistive sections 232.

The strain gauge 200 used in the strain measurement assembly 10, as shown in FIG. 1, could be embodied as the half bridge 210. In another embodiment, the half bridge 210 could be formed as the strain gauge 200' described above. In another embodiment, the strain measurement assembly 10 could use the full bridge 230 in place of the half bridge 210, with the layered structure of either the strain gauge 200 or the strain gauge 200'.

In usage of the strain measurement assembly 10, for the half bridge 210 shown in FIGS. 1 and 2, the first contact pad 222 is connected to a first terminal of a voltage source and the third contact pad 226 is connected to a second terminal of the voltage source. A voltage, for example 5V, is applied across the first contact pad 222 and the third contact pad 226. For the full bridge 230 shown in FIG. 6, the first contact pad 222 is connected to the first terminal and the third contact pad 226 is likewise connected to the second terminal.

An applied force flexes the force responsive member 100 and causes mechanical strain in the force responsive member 100. The mechanical strain is transmitted through the attachment material 300 and to the strain gauge 200. The resistor 250 in the strain gauge 200, 200' formed by the p-type doped section 242 or the p-type doped silicon layer 252 is a piezoresistor and changes in electrical resistance under the application of the mechanical strain. A voltage at the third contact pad 226 is sensed to determine the strain of the force responsive member 100 in the half bridge 210. The intermediate contact pads 228 in the half bridge 210 short the portions of the strain gauge 220 extending in the lateral direction T, so that the strain is measured by the portions of the strain gauge 220 extending along the longitudinal axis L. A voltage at the third contact pad 226 and the fourth contact pad 229 is sensed to determine the strain of the force responsive member 100 in the full bridge 230.

The conductive shield 260 protects the strain gauge 200, 200' from external field effects and keeps mobile ions away from the strain gauge 200, 200'. The first conductive shield 262 protects a top side of the strain gauge 200, 200' in the height direction H from the external field effects and the mobile ions while the second conductive shield 268 protects a bottom side of the strain gauge 200, 200' in the height direction H from the external field effects and the mobile ions. The mobile ions are equally attracted across the resistor 250 and the external field does not reach the resistor 250 due to the conductive shield 260. In an embodiment, the guard rings 280 provide further protection, effectively enclosing the resistor 250. The conductive shield 260, and the optional guard rings 280, increase the stability and reliability of the strain measured by the strain gauge 200, 200'.

What is claimed is:

1. A strain gauge, comprising:
    a resistor formed of a doped silicon material;
    a conductive shield; and
    an isolation element disposed between the resistor and the conductive shield and electrically isolating the resistor from the conductive shield, the resistor and the isolation element are formed within a single silicon substrate.

2. The strain gauge of claim 1, wherein the resistor is a p-type doped section of the silicon substrate.

3. The strain gauge of claim 2, wherein the isolation element is an n-type doped section of the silicon substrate forming a p-n junction with the p-type doped section.

4. The strain gauge of claim 3, wherein the conductive shield is formed within the single silicon substrate.

5. The strain gauge of claim 4, wherein the conductive shield is an n+-type highly doped section of the silicon substrate.

6. The strain gauge of claim 3, wherein the conductive shield is a metal layer on which the silicon substrate is disposed.

7. The strain gauge of claim 3, wherein the isolation element surrounds a lower side and a plurality of lateral sides of the resistor.

8. The strain gauge of claim 7, further comprising a guard ring formed within the single silicon substrate.

9. The strain gauge of claim 8, wherein the guard ring is an n+-type highly doped section of the silicon substrate section disposed at a same height as the resistor along a height direction and spaced apart from the lateral sides of the resistor in a lateral direction perpendicular to the height direction.

10. The strain gauge of claim 1, wherein the resistor is a p-type doped silicon layer and the isolation element is an oxide on which the p-type doped silicon layer is disposed.

11. The strain gauge of claim 10, wherein the conductive shield is an n+-type highly doped silicon substrate on which the oxide is disposed.

12. The strain gauge of claim 10, wherein the conductive shield is a metal layer on which the oxide is disposed.

13. The strain gauge of claim 1, wherein the isolation element includes a first isolation element disposed on a lower side of the resistor and a second isolation element disposed on an upper side of the resistor opposite the lower side.

14. The strain gauge of claim 13, wherein the conductive shield includes a first conductive shield disposed on a side of the first isolation element opposite the resistor and a second conductive shield disposed on a side of the second isolation element opposite the resistor.

15. The strain gauge of claim 13, further comprising a contact pad electrically connected to the resistor and extending through the second isolation element.

16. The strain gauge of claim 14, further comprising a passivation layer positioned over the second conductive shield.

17. A strain measurement assembly, comprising:
    a force responsive member;
    a strain gauge including a resistor formed of a doped silicon material, a conductive shield, and an isolation element disposed between the resistor and the conductive shield and electrically isolating the resistor from the conductive shield, the isolation element includes a first isolation element disposed on a lower side of the resistor and a second isolation element disposed on an upper side of the resistor opposite the lower side, the conductive shield includes a first conductive shield disposed on a side of the first isolation element opposite the resistor and a second conductive shield disposed on a side of the second isolation element opposite the resistor; and
    an attachment material attaching the strain gauge to the force responsive member.

18. A strain gauge, comprising:
    a resistor formed of a doped silicon material;
    a conductive shield;
    an isolation element disposed between the resistor and the conductive shield and electrically isolating the resistor from the conductive shield, the isolation element includes a first isolation element disposed on a lower side of the resistor and a second isolation element disposed on an upper side of the resistor opposite the lower side; and
    a contact pad electrically connected to the resistor and extending through the second isolation element.

* * * * *